US008780328B2

(12) United States Patent
Komatsuda

(10) Patent No.: US 8,780,328 B2
(45) Date of Patent: Jul. 15, 2014

(54) ILLUMINATION OPTICAL APPARATUS, EXPOSURE APPARATUS, AND DEVICE MANUFACTURING METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 925 days.

(21) Appl. No.: 12/703,270

(22) Filed: Feb. 10, 2010

(65) Prior Publication Data
US 2010/0141922 A1    Jun. 10, 2010

Related U.S. Application Data

(63) Continuation of application No. PCT/JP2008/062260, filed on Jul. 7, 2008.

(30) Foreign Application Priority Data

Aug. 10, 2007    (JP) .............................. P2007-208749

(51) Int. Cl.
G03B 27/54    (2006.01)
G03B 27/42    (2006.01)
G03F 7/20    (2006.01)

(52) U.S. Cl.
CPC .................................. *G03F 7/70066* (2013.01)
USPC ............................................. 355/67; 355/53

(58) Field of Classification Search
CPC ......................... G03F 7/70066; G03F 7/70825
USPC .......................... 355/53, 55, 67–71; 250/548; 356/399–401
See application file for complete search history.

(56) References Cited

U.S. PATENT DOCUMENTS

| 6,078,381 | A | * | 6/2000 | Suzuki | .......................... 355/53 |
| 6,104,474 | A | | 8/2000 | Suzuki | |
| 6,452,661 | B1 | | 9/2002 | Komatsuda | |

(Continued)

FOREIGN PATENT DOCUMENTS

| CN | 1400507 A | 3/2003 |
| JP | 2002-124453 | 4/2002 |
| JP | 2005-317611 | 11/2005 |
| WO | WO 2005/048326 A1 | 5/2005 |
| WO | WO 2006/126444 A1 | 11/2006 |

OTHER PUBLICATIONS

International Search Report in International Application No. PCT/JP2008/062260 (Aug. 26, 2008).

(Continued)

*Primary Examiner* — Hung Henry Nguyen
(74) *Attorney, Agent, or Firm* — Finnegan, Henderson, Farabow, Garrett & Dunner, LLP

(57) ABSTRACT

There is disclosed a illumination optical apparatus for illuminating a second surface optically conjugate with a first surface via a reflection type original plate which can be arranged on the first surface, the illumination optical apparatus comprising: a first partial field stop arranged to define a first outer edge of a illumination region which is to be formed on the second surface, in order to limit a light beam traveling toward the first surface; and a second partial field stop arranged to define a second outer edge of the illumination region, in order to limit a light beam reflecting from the reflection type original plate which can be arranged on the first surface, wherein a first distance between the first partial field stop and the first surface is set to be larger than a second distance between the second partial field stop and the first surface.

18 Claims, 7 Drawing Sheets

(56) References Cited

U.S. PATENT DOCUMENTS

| | | | |
|---|---|---|---|
| 6,906,789 B2 * | 6/2005 | Carter et al. | 355/75 |
| 7,196,774 B2 * | 3/2007 | Won et al. | 355/71 |
| 7,525,641 B2 * | 4/2009 | Zimmerman et al. | 355/69 |
| 8,059,261 B2 * | 11/2011 | Verweij et al. | 355/71 |
| 2003/0031017 A1 | 2/2003 | Tsuji | |
| 2004/0239283 A1 | 12/2004 | Galburt et al. | |
| 2005/0006605 A1 | 1/2005 | Won et al. | |
| 2005/0110972 A1 | 5/2005 | Tsuji et al. | |
| 2005/0236584 A1 * | 10/2005 | Tsuji | 250/492.1 |
| 2006/0290916 A1 | 12/2006 | Yamamoto et al. | |
| 2007/0014112 A1 | 1/2007 | Ohya et al. | |

OTHER PUBLICATIONS

Search report from the European Patent Office dated Mar. 15, 2011 corresponding to Application No. 08777933.6.

Translation of Office Action issued Dec. 23, 2013 in Taiwan patent application No. 097126621 (1022176317001) (4 pages).

Office Action issued Dec. 23, 2013 in Taiwan patent application No. 1022176317001.

* cited by examiner

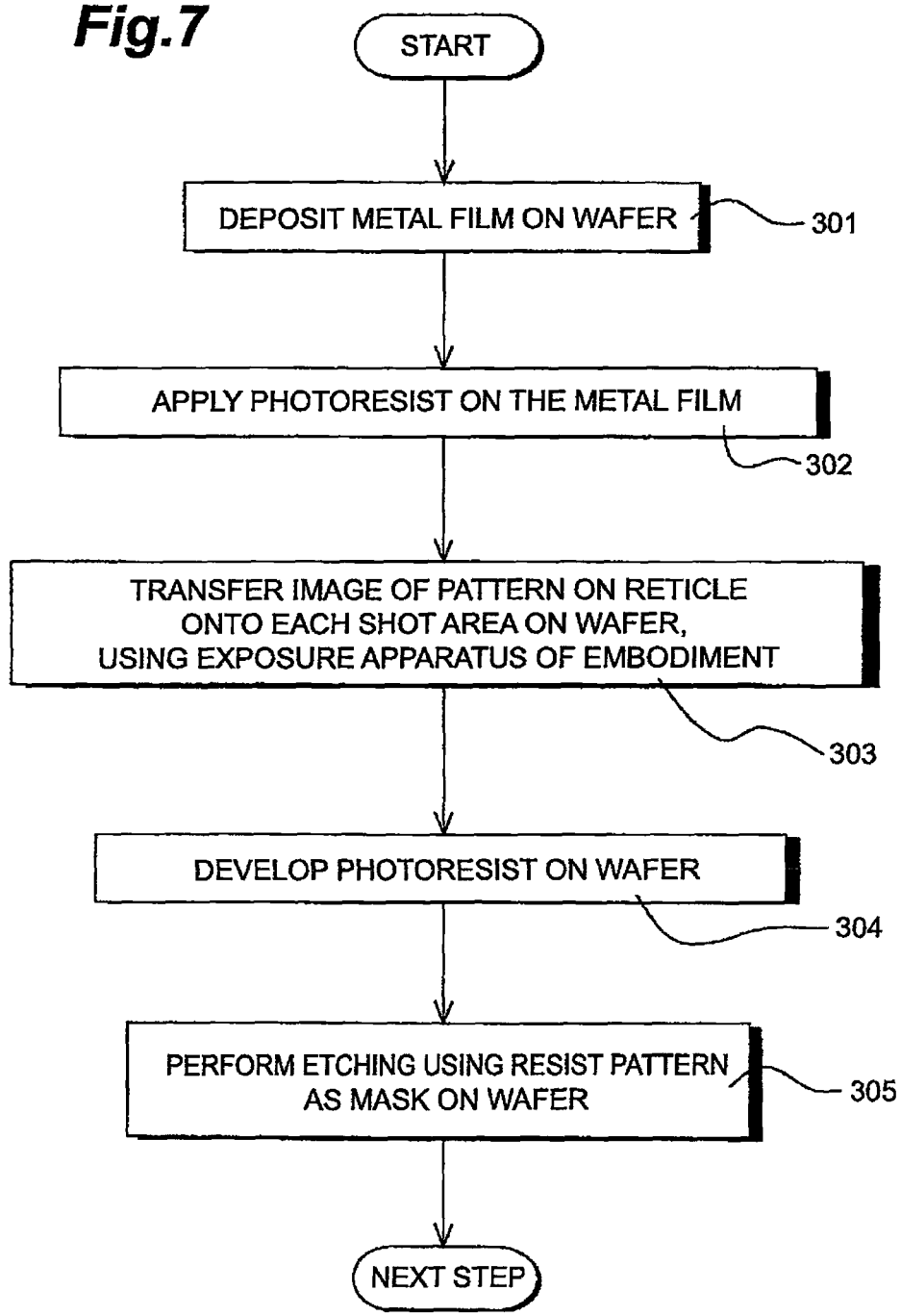

ILLUMINATION OPTICAL APPARATUS, EXPOSURE APPARATUS, AND DEVICE MANUFACTURING METHOD

CROSS-REFERENCE TO RELATED APPLICATIONS

This application is a continuation application of PCT/JP2008/062260 filed Jul. 7, 2008 claiming the benefit of priority of the Japanese Patent Application No. 2007-208749 filed on Aug. 10, 2007, the entire contents of which are incorporated herein by reference.

BACKGROUND

1. Field

An embodiment of the present invention relates to a illumination optical apparatus using a reflection type original plate such as a reflective mask, exposure apparatus, and a device manufacturing method. More particularly, the present invention relates to exposure apparatus used in manufacturing devices such as semiconductor devices, imaging devices, liquid crystal display devices, and thin-film magnetic heads by lithography.

2. Description of the Related Art

The conventional exposure apparatus used in manufacturing the semiconductor devices and others is configured to project and transfer a circuit pattern formed on a mask (reticle), onto a photosensitive substrate (e.g., a wafer) through a projection optical system. The photosensitive substrate is coated with a resist, and the resist is exposed to light by projection exposure through the projection optical system, thereby forming a resist pattern corresponding to the mask pattern. The resolving power of exposure apparatus is dependent on the wavelength of exposure light and the numerical aperture of the projection optical system.

Specifically, in order to increase the resolving power of exposure apparatus, it is necessary to decrease the wavelength of exposure light and increase the numerical aperture of the projection optical system. In general, it is difficult in terms of optical design to increase the numerical aperture of the projection optical system beyond a certain value, and it is thus necessary to decrease the wavelength of exposure light to a shorter wavelength. Therefore, the technique of EUVL (Extreme UltraViolet Lithography) is drawing attention as a next-generation exposure method of semiconductor patterning (exposure apparatus).

The EUVL exposure apparatus uses the EUV (Extreme UltraViolet) light having the wavelength in the range of about 5 to 50 nm, when compared with the conventional exposure methods using the KrF excimer laser light at the wavelength of 248 nm and the ArF excimer laser light at the wavelength of 193 nm. When the EUV light is used as exposure light, there is no available optical material that can transmit the light. For this reason, the EUVL exposure apparatus has to use a reflection type optical integrator, a reflection type mask (in general, a reflection type original plate), and a reflection type projection optical system (see U.S. Pat. No. 6,452,661)

SUMMARY

The EUVL exposure apparatus is configured to secure, for example, an arcuate static exposure region on the image plane of the reflection type projection optical system and to perform scan exposure (scanning exposure) of the mask pattern on the photosensitive substrate with movement of the mask and the photosensitive substrate relative to the projection optical system. Therefore, it is necessary to set a field stop to define the static exposure region, at a position nearly optically conjugate with the photosensitive substrate, e.g., near the mask.

Specifically, the field stop located near the mask has a first partial field stop to limit a light beam traveling toward the mask, thereby to define one arcuate outer edge of the static exposure region, and a second partial field stop to limit a light beam reflecting from the mask, thereby to define the other arcuate outer edge. The first partial field stop and the second partial field stop are located on an identical plane in accordance with the concept of the field stop in the ordinary optical system, i.e., along an identical plane parallel to the mask near the mask.

In this case, the second partial field stop blocks part of light reflecting from the mask, i.e., part of light traveling toward the photosensitive substrate while carrying the information of the mask pattern, and this blocking of light by the second partial field stop is prone to cause an adverse effect on the image formation of the pattern on the photosensitive substrate. The adverse effect on the image formation is reduced by decreasing the distance between the second partial field stop and the mask. However, the decrease in the distance between the second partial field stop and the mask results in locating the first partial field stop and the second partial field stop nearer to the position optically conjugate with the photosensitive substrate, whereby the field stop becomes more likely to be projected onto the photosensitive substrate and it becomes difficult eventually to keep an exposure amount distribution constant on the photosensitive substrate.

The present invention has been accomplished in view of the above-described problem and it is an object of the present invention to provide a illumination optical apparatus capable of achieving both suppression of the adverse effect of the field stop on the image formation and improvement in uniformity of the exposure amount distribution, for example, when applied to the exposure apparatus using the reflection type original plate. It is another object of the present invention to provide exposure apparatus capable of achieving excellent exposure under a good exposure condition, using the reflection type original plate and the illumination optical apparatus achieving both the suppression of the adverse effect of the field stop on the image formation and the improvement in uniformity of the exposure amount distribution.

In order to solve the above problem, a first aspect of an embodiment of the present invention is to provide a illumination optical apparatus for illuminating a second surface optically conjugate with a first surface via a reflection type original plate which can be arranged on the first surface, the illumination optical apparatus comprising:

a first partial field stop arranged to define a first outer edge of a illumination region which is to be formed on the second surface, in order to limit a light beam traveling toward the first surface; and a second partial field stop arranged to define a second outer edge of the illumination region in order to limit a light beam reflecting from the reflection type original plate which can be arranged on the first surface, wherein a first distance between the first partial field stop and the first surface is set to be larger than a second distance between the second partial field stop and the first surface.

A second aspect of the embodiment of the present invention is to provide exposure apparatus comprising the illumination optical apparatus of the first aspect, and further comprising a projection optical system for forming an image of the reflection type original plate arranged on the first surface, on a photosensitive substrate arranged on the second surface.

A third aspect of the embodiment of the present invention is to provide a device manufacturing method comprising:

exposing a pattern of the reflection type original plate on the photosensitive substrate, using the exposure apparatus of the second aspect; and developing the photosensitive substrate after the exposure block.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 7 is a drawing showing a flowchart of an example of a method for manufacturing semiconductor devices as micro devices.

DESCRIPTION

Figure 1:
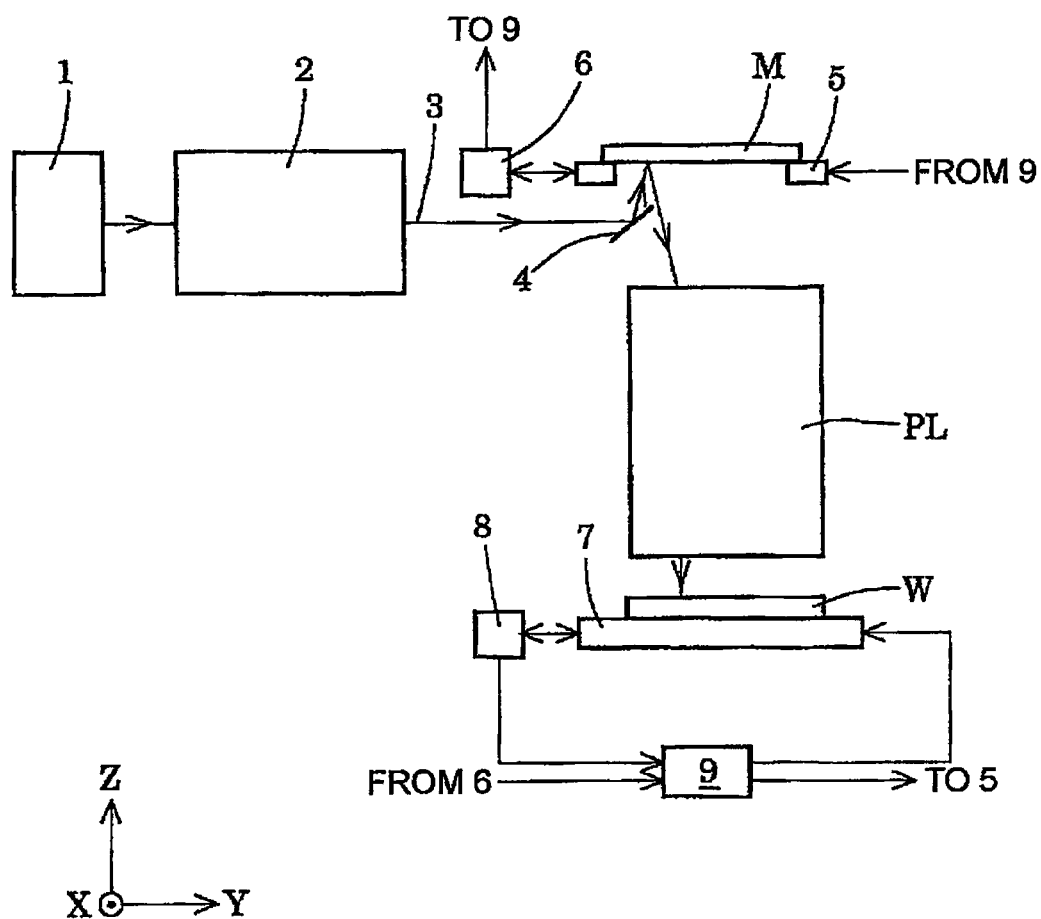
FIG. 1 is a drawing schematically showing an overall configuration of exposure apparatus according to an embodiment of the present invention.
Figure 2:
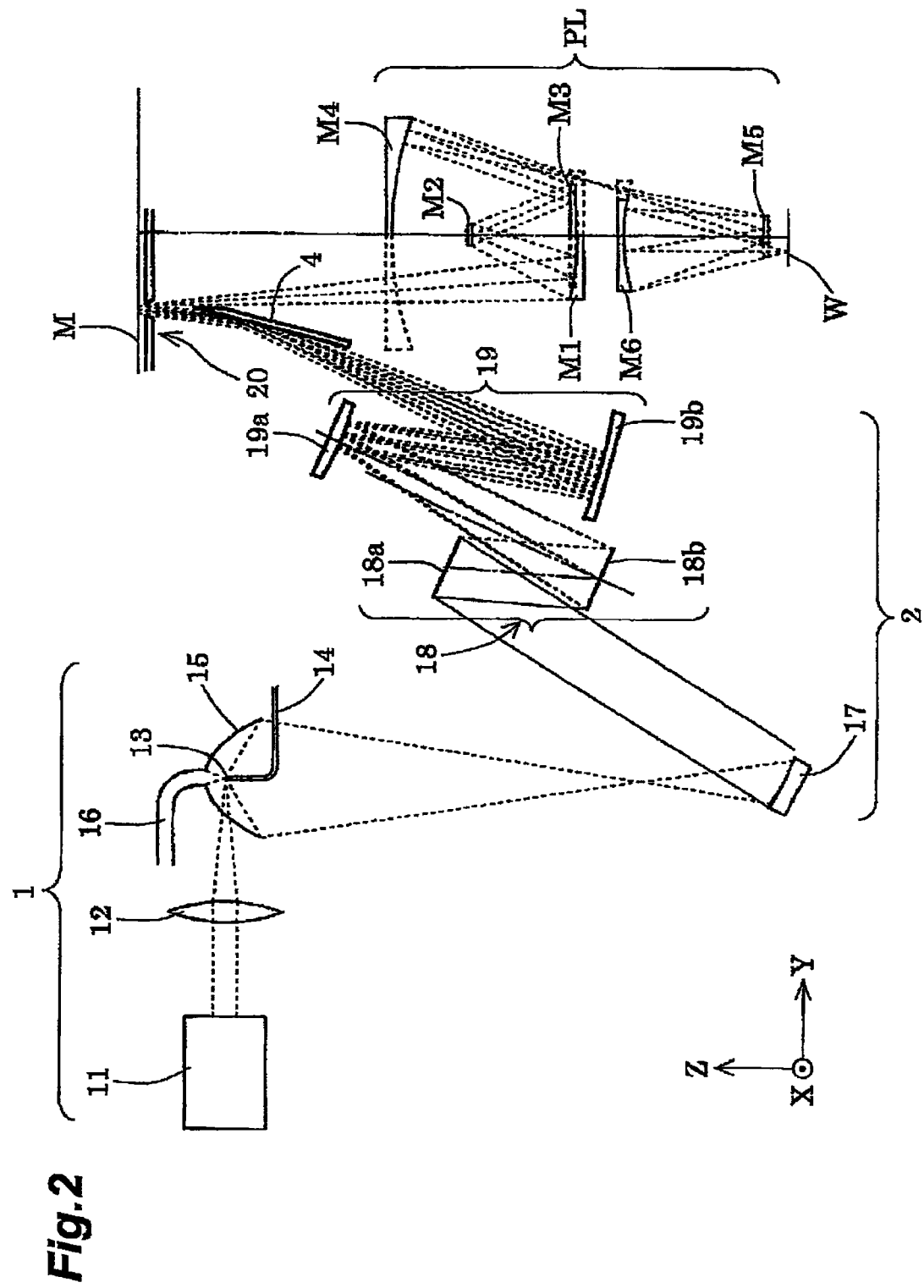
FIG. 2 is a drawing schematically showing internal configurations of a light source, a illumination optical system, and a projection optical system shown in FIG. 1.

An embodiment of the present invention will be described on the basis of the accompanying drawings. FIG. 1 is a drawing schematically showing an overall configuration of exposure apparatus according to the embodiment of the present invention. FIG. 2 is a drawing schematically showing internal configurations of a light source, an illumination optical system, and a projection optical system shown in FIG. 1. In FIG. 1, the Z-axis is set along a direction of an optical axis of the projection optical system or a direction of a normal to a wafer being a photosensitive substrate, the Y-axis along a direction parallel to the plane of FIG. 1 in the wafer surface, and the X-axis along a direction normal to the plane of FIG. 1 in the wafer surface.

Referring to FIG. 1, the exposure apparatus of the present embodiment is provided, for example, with a laser plasma light source 1 as a light source for supplying exposure light. Light emitted from the light source 1 travels through a wavelength selecting filter (not shown) to enter the illumination optical system 2. The wavelength selecting filter herein has a property to selectively transmit only EUV light of a predetermined wavelength (e.g., 13.4 nm), out of the light supplied from the light source 1, and to block transmission of light at the other wavelengths. The EUV light 3 emerging from the wavelength selecting filter travels via the illumination optical system 2 and a plane reflecting mirror 4 as a path deflecting mirror to light a reflection type mask (reticle) M on which a pattern to be transferred is formed.

The mask M is held by a mask stage 5 movable along the Y-direction, in such a state that its pattern surface extends along the XY plane. The exposure apparatus is configured to measure movement of the mask stage 5 with a laser interferometer 6. Light from the pattern of the mask M thus lighted travels via a reflection type projection optical system PL to form an image of the mask pattern on a wafer W being a photosensitive substrate. Namely, for example, an arcuate static exposure region (effective exposure region), which is symmetric with respect to the Y-axis, is formed on the wafer W, as described below.

The wafer W is held by a wafer stage 7 two-dimensionally movable along the X-direction and the Y-direction, in such a state that its exposure surface extends along the XY plane. The exposure apparatus is configured to measure movement of the wafer stage 7 with a laser interferometer 8 in the same manner as in the case of the mask stage 5. The measurement result with the laser interferometer 6 and the measurement result with the laser interferometer 8 are supplied to a control unit 9. The control unit 9 controls each of the movements of the mask stage 5 and the wafer stage 7 along the Y-direction, based on the outputs from the laser interferometers 6 and 8.

As so configured, the pattern on the mask M is transferred onto a rectangular shot area on the wafer W by performing scanning exposure (scan exposure) with movement of the mask M and wafer W along the Y-direction relative to the projection optical system PL. At this time, when the projection magnification (transfer magnification) of the projection optical system PL is, for example, ¼, synchronous scanning is carried out while a moving speed of the wafer stage 7 is set to be quarter of a moving speed of the mask stage 5. By repeating the scanning exposure with two-dimensional movement of the wafer stage 7 along the X-direction and the Y-direction, the pattern on the mask M is sequentially transferred onto each of shot areas on the wafer W.

Referring to FIG. 2, the laser plasma light source 1 shown in FIG. 1 is composed of a laser light source 11, a condensing lens 12, a nozzle 14, an ellipsoidal reflecting mirror 15, and a duct 16. Light (non-EUV light) emitted from the laser light source 11 is focused on a gas target 13 by the condensing lens 12. For example, a high-pressure gas consisting of xenon (Xe) is supplied from the nozzle 14 and the gas jetted out from the nozzle 14 forms the gas target 13. The gas target 13 acquires energy from the focused laser beam to create plasma, from which EUV light is emitted. The gas target 13 is positioned at the first focus of the ellipsoidal reflecting mirror 15.

Therefore, the EUV light emitted from the laser plasma light source 1 is focused at the second focus of the ellipsoidal reflecting mirror 15. On the other hand, the gas after the emission of light is suctioned through the duct 16 to be guided to the outside. The EUV light focused at the second focus of the ellipsoidal reflecting mirror 15 is focused into substantially parallel beam by a concave reflecting mirror 17 and directs to an integrator 18 consisting of a pair of fly's eye optical systems 18a and 18b. The first fly's eye optical system 18a is composed of a plurality of reflecting mirror elements arranged in parallel. The second fly's eye optical system 18b is composed of a plurality of reflecting mirror elements arranged in parallel so as to be in one-to-one correspondence to the plurality of reflecting mirror elements of the first fly's eye optical system 18a. Concerning a specific configuration and effect of the first fly's eye optical system 18a and the second fly's eye optical system 18b, reference is made to U.S. Pat. No. 6,452,661, the disclosure of which is incorporated herein by reference as part of the present invention to the maximum extent possible.

In this manner, a substantial extended source having a predetermined shape is formed near an exit surface of the optical integrator 18, i.e., near a reflecting surface of the second fly's eye optical system 18b. This substantial extended source is formed at the position of the exit pupil of the illumination optical system 2, i.e., at a position optically conjugate with the entrance pupil of the projection optical system PL. Light from the substantial extended source travels, for example, via a condenser optical system 19 composed of a convex reflecting mirror 19a and a concave reflecting mirror 19b and emits from the illumination optical system 2.

The light emitted from the illumination optical system 2 is deflected by the plane reflecting mirror 4 and travels through an arcuate aperture (light transmitting portion) of a field stop 20 located near the mask M, to form an arcuate illumination region on the mask M. A configuration and effect of the field stop 20 will be described later. In this manner, the light source 1 (11-16), illumination optical system 2 (17-19), plane reflecting mirror 4, and field stop 20 constitute a illumination system for illuminating the mask M with the predetermined pattern by Köhler illumination.

Light from the pattern on the mask M thus lighted travels via the projection optical system PL to form an image of the mask pattern in an arcuate static exposure region on the wafer W. The projection optical system PL is composed of a first reflective imaging optical system for forming an intermediate image of the pattern of the mask M, and a second reflective imaging optical system for forming an image of the intermediate image of the mask pattern (i.e., a secondary image of the pattern of the mask M) on the wafer W. The first reflective imaging optical system is composed of four reflecting mirrors M1-M4 and the second reflective imaging optical system is composed of two reflecting mirrors M5 and M6. The projection optical system PL is an optical system telecentric on the wafer side (image side).

Figure 3:
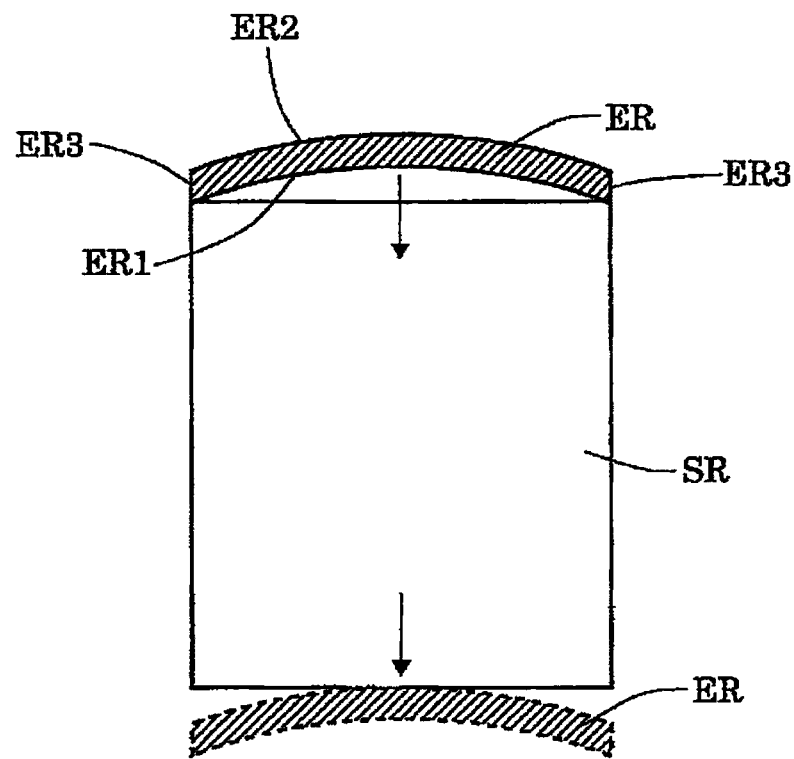
FIG. 3 is a drawing schematically illustrating a scanning exposure process in the embodiment.

FIG. 3 is a drawing schematically illustrating a scanning exposure process in the present embodiment. Referring to FIG. 3, the exposure apparatus of the present embodiment is configured to form an arcuate static exposure region (effective exposure region) ER symmetric with respect to the Y-axis, so as to correspond to the arcuate effective image region and effective field of the projection optical system PL. This arcuate static exposure region ER moves from a scan start position indicated by solid lines in the drawing to a scan end position indicated by dashed lines in the drawing, during transferring the pattern of the mask M onto one rectangular shot area SR of the wafer W by a single scanning exposure (scan exposure).

Figure 4:
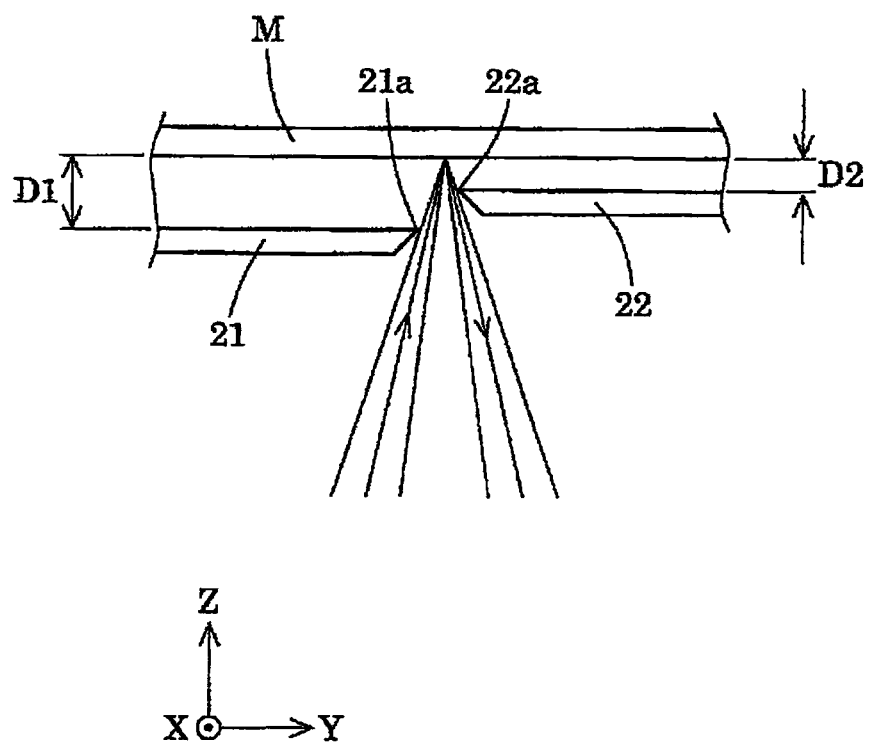
FIG. 4 is a side view schematically showing a main configuration of a field stop in the embodiment.
Figure 5:
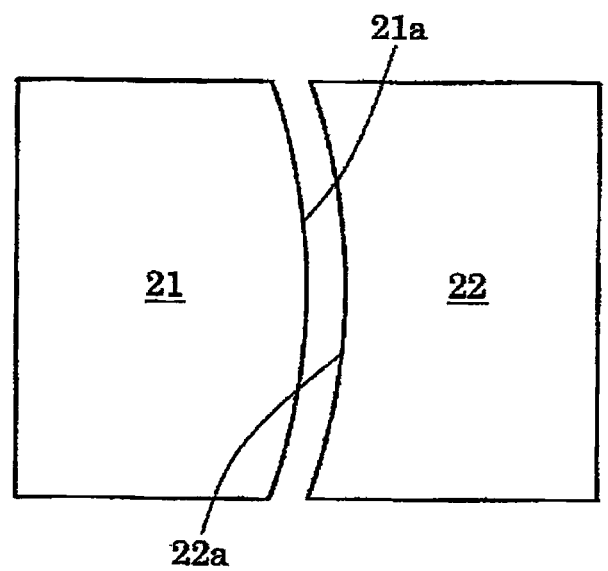
FIG. 5 is a top plan view schematically showing the main configuration of the field stop in the embodiment.
Figure 5:
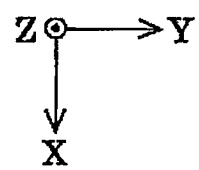

FIG. 4 is a side view schematically showing a main configuration of the field stop in the present embodiment. FIG. 5 is a top plan view schematically showing the main configuration of the field stop in the present embodiment. Referring to FIGS. 4 and 5, the field stop 20, which is located near the mask M as a reflection type original plate, has a first partial field stop 21 to limit a light beam traveling toward the mask M, and a second partial field stop 22 to limit a light beam reflecting from the mask M.

The first partial field stop 21 has an edge 21a of a convex arcuate shape on the +Y-directional side (the second partial field stop 22 side) and is arranged to define one arcuate outer edge ER1 (cf. FIG. 3) of the static exposure region ER to be formed on the wafer W. The second partial field stop 22 has an edge 22a of a concave arcuate shape on the −Y-directional side (the first partial field stop 21 side) and is arranged to define the other arcuate outer edge ER2 (cf. FIG. 3) of the static exposure region ER.

The field stop 20 is further provided with a pair of partial field stops (not shown) arranged so as to define a pair of linear outer edges ER3 extending along the scanning direction (Y-direction) of the static exposure region ER. However, since the pair of partial field stops of this kind are well known, the detailed description of the configuration thereof is omitted herein.

In the present embodiment, different from the conventional technology, a distance D1 between the first partial field stop 21 and the mask M is set to be larger than a distance D2 between the second partial field stop 22 and the mask M. As described above, if the light reflected by the mask M is blocked in part, i.e., if the light traveling toward the wafer W while carrying the information of the mask pattern is blocked in part, the blocking of light is prone to cause an adverse effect on the image formation of the pattern on the wafer W. In the present embodiment the distance D2 between the second partial field stop 22 and the mask M is made relatively smaller than the distance D1, which lessens the adverse effect on the image formation of the pattern due to the blocking of light by the second partial field stop 22.

In the present embodiment, the distance D2 between the second partial field stop 22 and the mask M is set to the distance to lessen the adverse effect on the image formation of the pattern. This distance can be determined according to specifications required of equipment.

On the other hand, the first partial field stop 21 arranged at the position relatively far from the mask M limits part of the light beam traveling toward the mask M, but the limitation of the light beam by the first partial field stop 21 does not adversely affect the image formation of the pattern on the wafer W. Since the present embodiment adopts the control on the exposure amount as described, for example, in U.S. Pat. No. 6,104,474, the distance D1 between the first partial field stop 21 and the mask M can be increased so as to blur the outer edge ER1 of the arcuate shape of the static exposure region ER by a required amount.

In other words, the first partial field stop 21 can be located away by an amount necessary for the exposure control from the position optically conjugate with the wafer W (i.e., from the pattern surface of the mask M). This configuration can prevent influence on resolution while locating the first partial field stop 21 at the position suitable for the exposure control. U.S. Pat. No. 6,104,474 is incorporated herein by reference as the disclosure of the present specification to the maximum extent possible.

In the illumination optical apparatus of the present embodiment, as described above, the distance D1 between the first partial field stop 21 and the mask M is set to be larger than the distance D2 between the second partial field stop 22 and the mask M, whereby the illumination optical apparatus is able to achieve the improvement in uniformity of the exposure amount distribution on the wafer W by the first partial field stop 21 while lessening the adverse effect of the second partial field stop 22 on the image formation on the wafer W. As a consequence, the exposure apparatus of the present embodiment is able to achieve both the suppression of the adverse effect of the field stop 20 on the image formation and the improvement in uniformity of the exposure amount distribution and, in turn, to perform excellent exposure under a good exposure condition.

When the distance D1 between the first partial field stop 21 and the mask M and the distance D2 between the second partial field stop 22 and the mask M satisfy Condition (1) below, it is easy to make a balance between the suppression of the adverse effect of the field stop 20 on the image formation and the improvement in uniformity of the exposure amount distribution.

$$1\ mm < D1 - D2 \tag{1}$$

Figure 6:
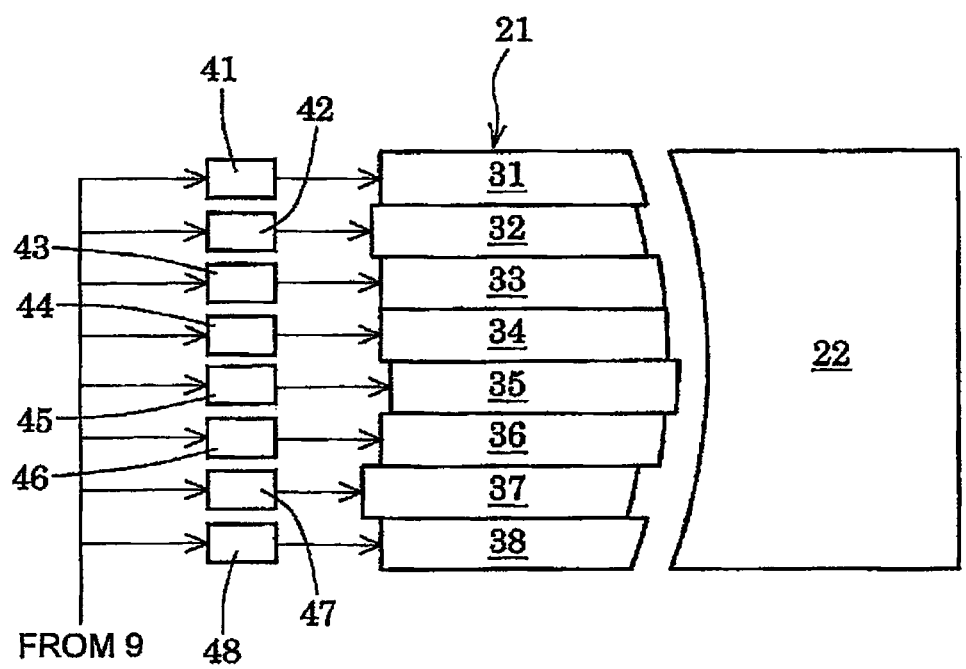
FIG. 6 is a drawing schematically showing a main configuration of a field stop in a modification example.

For controlling the exposure amount more accurately, the edge shape of the first partial field stop 21 can be arranged as variable, for example, as shown in FIG. 6. In the modification example of FIG. 6, the first partial field stop 21 is composed of a plurality of stop members 31-38 (eight members shown as an example in FIG. 6) divided in an orthogonal-to-scan direction (X-direction) orthogonal to the scanning direction, and eight drive units 41-48 for moving these respective eight stop members 31-38 along the scanning direction (Y-direction) independently of each other.

The drive units 41-48 can be actuators, for example, like ultrasonic motors. In the modification example of FIG. 6, operations of the drive units 41-48 are controlled independently of each other in accordance with commands from the control unit 9 to move the respective eight stop members 31-38 along the Y-direction, thereby changing the edge shape of the first partial field stop 21. As a result, the width along the scanning direction (Y-direction) of the static exposure region ER is adjusted at each position along the orthogonal-to-scan direction (X-direction), whereby the exposure amount distribution on the wafer W can be controlled with high accuracy.

Although the modification example of FIG. 6 adopts the configuration wherein the edge shape of the first partial field stop 21 is arranged as variable, the present invention does not always have to be limited to this, but may adopt a configuration wherein the edge shape of the second partial field stop 22 is arranged as variable, with the same effect. However, since the second partial field stop 22 is arranged at the position relatively close to the mask M, it is easier to design the field stop so as to avoid mechanical interference between members in the configuration wherein the edge shape of the first partial field stop 21 is arranged as variable than in the configuration wherein the edge shape of the second partial field stop 22 is arranged as variable. Furthermore, instead of the configuration wherein the partial field stop is divided, it is also possible to adopt a stop of a chain type as disclosed in U.S. Pat. No. 5,895,737. The disclosure of U.S. Pat. No. 5,895,737 is incorporated herein by reference as the description of the present invention to the maximum extent possible.

The above embodiment described the configuration and action of the present invention on the basis of the example in which the arcuate static exposure region ER is secured on the image plane of the projection optical system PL. Without having to be limited thereto, however, it is possible to adopt a variety of modification examples as to the shape of the static exposure region (illumination region) to be formed on the wafer being the photosensitive substrate.

The exposure apparatus according to the above embodiment is configured to light the mask by the illumination system (illumination block) and to effect exposure of the transfer pattern of the mask on the photosensitive substrate by the projection optical system (exposure block), whereby it can manufacture micro devices (semiconductor devices, imaging devices, liquid crystal display devices, thin-film magnetic heads, and so on). The below will describe an example of a method for forming a predetermined circuit pattern on a wafer or the like as a photosensitive substrate through the use of the exposure apparatus of the present embodiment, thereby to obtain semiconductor devices as micro devices, with reference to the flowchart of FIG. 7.

First, block 301 in FIG. 7 is carried out to deposit a metal film on a wafer in a lot. Next block 302 is to apply a photoresist onto the metal film on the wafer in the lot. Thereafter, block 303 is carried out to, using the exposure apparatus of the present embodiment, successively transfer an image of a pattern on a mask (reticle) through the projection optical system thereof onto each of shot areas on the wafer in the lot.

Thereafter, block 304 is carried out to develop the photoresist on the wafer in the lot and subsequent block 305 is to perform etching using the resist pattern as a mask on the wafer in the lot, thereby forming a circuit pattern corresponding to the pattern on the mask, in each shot area on each wafer. Thereafter, devices such as semiconductor devices are manufactured through blocks including formation of circuit patterns in upper layers. The above-described semiconductor device manufacturing method permits us to obtain the semiconductor devices having extremely fine circuit patterns with a good throughput.

The EUVL exposure apparatus according to the above embodiment uses the laser plasma light source as a light source for supplying the EUV light. Without having to be limited to this, however, it is also possible to adopt another appropriate light source to supply the EUV light, e.g., a synchrotron orbit radiation (SOR) source.

The above embodiment is the application of the present invention to the EUVL exposure apparatus. Without having to be limited to this, however, the present invention is also applicable to other exposure apparatus using the reflection type mask (reflection type original plate) and further applicable generally to the illumination optical apparatus for illuminating a second surface optically conjugate with a first surface via the reflection type original plate which can be arranged on the first surface.

The illumination optical apparatus of the above embodiments of the present invention is the illumination optical apparatus for illuminating the second surface optically conjugate with the first surface via the reflection type original plate which can be arranged on the first surface, wherein the distance between the first surface and the first partial field stop to limit the light beam traveling toward the first surface, thereby to define the first outer edge of the illumination region on the second surface is set to be larger than the distance between the first surface and the second partial field stop to limit the light beam reflecting from the reflection type original plate which can be arranged on the first surface, thereby to define the second outer edge of the illumination region. Therefore, for example, when the illumination optical apparatus of the present invention is applied to the exposure apparatus using the reflection type original plate, the first partial field stop improves the uniformity of the exposure amount distribution, while lessening the adverse effect of the second partial field stop on the image formation.

In this manner, for example, when the illumination optical apparatus of the present invention is applied to the exposure apparatus using the reflection type original plate, it is feasible to achieve both the suppression of the adverse effect of the field stop on the image formation and the improvement in uniformity of the exposure amount distribution. Therefore, the exposure apparatus of the present invention is able to perform excellent exposure under a good exposure condition, using the reflection type original plate and the illumination optical apparatus achieving both the suppression of the adverse effect of the field stop on the image formation and the improvement in uniformity of the exposure amount distribution, and thereby to manufacture devices with excellent performance.

It should be noted that the embodiments given above were described for facilitating the understanding of the present invention but not for limiting the present invention. Therefore, the elements disclosed in the above embodiments are intended to embrace all design changes and equivalents belonging to the technical scope of the present invention.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical apparatus for illuminating a second surface optically conjugate with a first surface via a reflection type original plate arranged on the first surface, the illumination optical apparatus comprising:
   a first partial field stop positioned near the original plate, the first partial field stop being configured to partially block a first light beam obliquely incident on the original plate; and
   a second partial field stop positioned near the original plate, the second partial field stop being configured to partially block a second light beam generated by the original plate by reflecting the first light beam,
   wherein a first distance between the first partial field stop and the first surface is set to be larger than a second distance between the second partial field stop and the first surface.

2. The illumination optical apparatus according to claim 1, satisfying the following condition:

$$1\ mm < D1 - D2,$$

where D1 is the first distance and D2 the second distance.

3. The illumination optical apparatus according to claim 1, wherein the first partial field stop and the second partial field stop are arranged without a reflecting mirror between the first partial field stop and the reflection type original plate and between the second partial field stop and the reflection type original plate.

4. An exposure apparatus comprising:
   the illumination optical apparatus as set forth in claim 1; and
   a projection optical system for forming an image of the original plate on a photosensitive substrate arranged on the second surface.

5. The exposure apparatus according to claim 4, further comprising:
   an original plate stage supporting the original plate; and
   a substrate stage supporting the photosensitive substrate, wherein the image of the original plate is formed on the photosensitive substrate with movement of the original plate stage and the substrate stage along a predetermined direction relative to the projection optical system.

6. The exposure apparatus according to claim 4, wherein the first partial field stop comprises:
   a plurality of members; and
   a drive unit to drive at least one of the members, the exposure apparatus being configured to change a width of the illumination region formed by the first partial field stop and the second partial field stop.

7. A device manufacturing method, comprising:
   exposing a pattern of a reflection type original plate on a photosensitive substrate by performing the steps of:
   directing a first light beam to be obliquely incident on reflective type original plate;
   partially blocking the first light beam using a first partial field stop positioned near the original plate;
   generating a second light beam by reflecting the first light beam using the original plate; and
   partially blocking the second light beam using a second partial field stop positioned near the original plate, wherein a first distance between the first partial field stop and the original plate is set to be larger than a second distance between the second partial field stop and the original plate;
   developing the photosensitive substrate to form a mask layer; and
   processing a surface of the photosensitive substrate through the mask layer.

8. The illumination optical apparatus according to claim 1, wherein the first light beam and the second light beam are arranged in a plane perpendicular to the original plate.

9. The illumination optical apparatus according to claim 8, wherein the first light beam and the second light beam are located on opposite sides of an illumination region formed on the original plate.

10. The illumination optical apparatus according to claim 2, wherein the first partial field stop and the second partial field stop are arranged without a reflecting mirror between the first partial field stop and the original plate and between the second partial field stop and the original plate.

11. The illumination optical apparatus according to claim 2, wherein the first partial field stop comprises:
   a plurality of members; and
   a drive unit to drive at least one of the members, the exposure apparatus being configured to change a width of the illumination region formed by the first partial field stop and the second partial field stop.

12. The illumination optical apparatus according to claim 1, wherein the first partial field stop comprises:
   a plurality of members; and
   a drive unit to drive at least one of the members, the exposure apparatus being configured to change a width of the illumination region formed by the first partial field stop and the second partial field stop.

13. An illumination optical apparatus for illuminating a second surface optically conjugate with a first surface via a reflection type original plate, the illumination optical apparatus comprising:
   a first partial field stop positioned near the original plate, the first partial field stop being configured to partially block a first light beam obliquely incident on the original plate; and
   a second partial field stop positioned near the original plate, the second partial field stop being configured to partially block a second light beam generated by the original plate by reflecting the first light beam, wherein:
   the first partial field stop is arranged parallel to the first surface and on a first side of an illumination region formed on the first surface,
   the second partial field stop is arranged on a second side of the illumination region opposite the first side, and
   a first distance between the first partial field stop and the first surface is set to be larger than a second distance between the second partial field stop and the first surface.

14. The illumination optical apparatus according to claim 13, satisfying the following condition:

$$1\ mm < D1 - D2,$$

where D1 is the first distance and D2 is the second distance.

15. The illumination optical apparatus according to claim 14, wherein the first partial field stop and the second partial field stop are arranged without a reflecting mirror between the first partial field stop and the reflection type original plate and between the second partial field stop and the reflection type original plate.

16. An exposure apparatus comprising:
   the illumination optical apparatus as set forth in claim 13; and a projection optical system for forming an image of the original plate on a photosensitive substrate arranged on the second surface.

17. The illumination optical apparatus according to claim 13, wherein the first light beam and the second light beam are arranged in a plane perpendicular to the original plate.

18. The illumination optical apparatus according to claim 17, wherein the first light beam and the second light beam are located on opposite sides of an illumination region formed on the original plate.

* * * * *